United States Patent
Tellez Oliva

(10) Patent No.: US 8,993,375 B2
(45) Date of Patent: Mar. 31, 2015

(54) METHOD FOR SYNTHESIZING A MATERIAL, IN PARTICULAR DIAMONDS, BY CHEMICAL VAPOR DEPOSITION, AS WELL AS DEVICE FOR APPLYING THE METHOD

(75) Inventor: Horacio Tellez Oliva, Gilly (BE)

(73) Assignee: Diarotech, Gilly (BE)

( * ) Notice: Subject to any disclaimer, the term of this patent is extended or adjusted under 35 U.S.C. 154(b) by 28 days.

(21) Appl. No.: 13/813,268

(22) PCT Filed: Aug. 1, 2011

(86) PCT No.: PCT/EP2011/063255
§ 371 (c)(1),
(2), (4) Date: Jul. 3, 2013

(87) PCT Pub. No.: WO2012/013824
PCT Pub. Date: Feb. 2, 2012

(65) Prior Publication Data
US 2013/0280860 A1 Oct. 24, 2013

(30) Foreign Application Priority Data
Jul. 30, 2010 (BE) .................................. 2010/0472

(51) Int. Cl.
*H01L 21/00* (2006.01)
*H01L 21/02* (2006.01)
(Continued)

(52) U.S. Cl.
CPC .......... *H01L 21/02527* (2013.01); *C23C 16/27* (2013.01); *C23C 16/278* (2013.01); *C23C 16/30* (2013.01); *C23C 16/52* (2013.01); *H01L 21/02532* (2013.01)
USPC ..... 438/105; 438/478; 427/249.7; 427/249.8; 118/723 VE

(58) Field of Classification Search
None
See application file for complete search history.

(56) References Cited

U.S. PATENT DOCUMENTS 4,898,748 A 2/1990 Kruger, Jr.
5,478,608 A 12/1995 Gorokhovsky

FOREIGN PATENT DOCUMENTS

WO WO 2009/005862 1/2009

OTHER PUBLICATIONS

Jie Ma et al. "Laser-aided diagnosis of the gas phase chemistry in microwave activated plasmas used for depositing diamond thin film." Proceedings of the 13th International Symposium on Laser-Aided Plasma Diagnostics: Sep. 18-21, 2007, vol. 68, pp. 206-211, XP009146265.

(Continued)

*Primary Examiner* — Yasser A Abdelaziez
(74) *Attorney, Agent, or Firm* — Jacobson Holman PLLC

(57) ABSTRACT

Method for synthesizing a material by chemical vapor deposition (CVD), according to which a plasma is created in a vacuum chamber in the vicinity of a substrate, and according to which a carbon-carrying substance and $H_2$ are introduced into the chamber in order to produce in the chamber a gas comprising substances carrying reactive-carbon atoms in the form of unsaturated molecules or radicals from which the synthesis of said material will be performed, and in that the electromagnetic absorption and inelastic diffusion spectra of the solid material to be synthesized are used to take from these spectra the absorption frequencies that contribute to the reactions that lead to the formation of the solid material to be synthesized, and in that energetic rays are produced in the form of a photon beam carrying quantities of energy determined by each of the frequencies corresponding to said absorption and inelastic diffusion frequencies, said photon beam being injected into the plasma where, for energy states of the solid material, an absorption of these photons having the energy corresponding to these energy states is effected by the substances carrying said reactive-carbon atoms.

24 Claims, 10 Drawing Sheets

(51) Int. Cl.
*C23C 16/27* (2006.01)
*C23C 16/30* (2006.01)
*C23C 16/52* (2006.01)

(56) References Cited

OTHER PUBLICATIONS

Popov et al. "Chemical bonding study of nanocrystailine diamond films prepared by plasma techniques." Thin Solid Films, vol. 506-507, May 26, 2006, pp. 297-302, XP025005711.

Lee et al. "Crystalline SiGe films grown on Si substrates using laser-assisted plasma-enhanced chemical vapor deposition at low temperature." Applied Physics Letters, AIP, American Institute of Physics, vol. 91, No. 9, Aug. 30, 2007, pp. 91920 XP012100867.

Butler et al. "Understanding the chemical vapour deposition of diamond: recent progress," Journal of Physics Condensed Matter 21, 2009.

Klein et al. "Critical-point phonon frequencies of diamond." Physical Review B. vol. 45, n. 22, Jun. 1, 1992.

Vogelgesang et al. "Multiphonon Raman and infrared spectra of isotropically controlled diamond." Physical Review B, vol. 58, No. 9, Sep. 1998, pp. 5408-5416.

Ramdas "Raman, Brillouin, and infrared spectroscopy of photons in conventional diamond," IEE, Jul. 2000.

Hoesch. "Discovery of phonons causing superconductivity in diamonds looking for room temperature—superconductors in diamonds." JAEA R&D Review 2007, p. 45.

Fig. 9
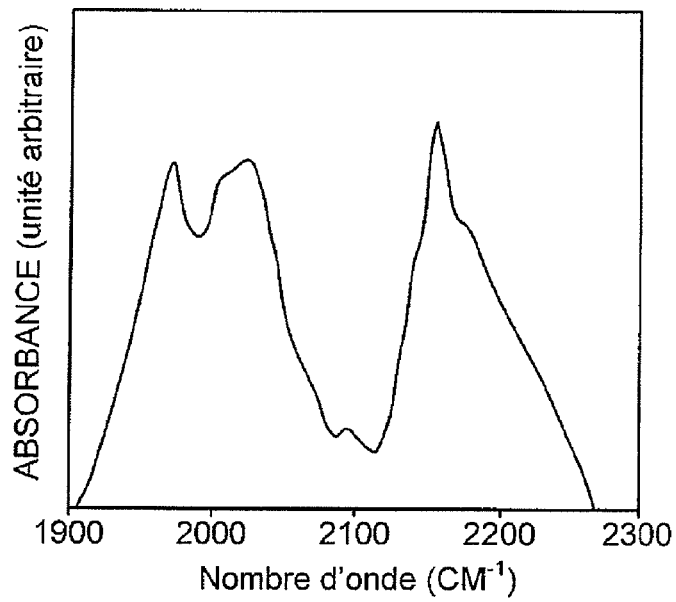
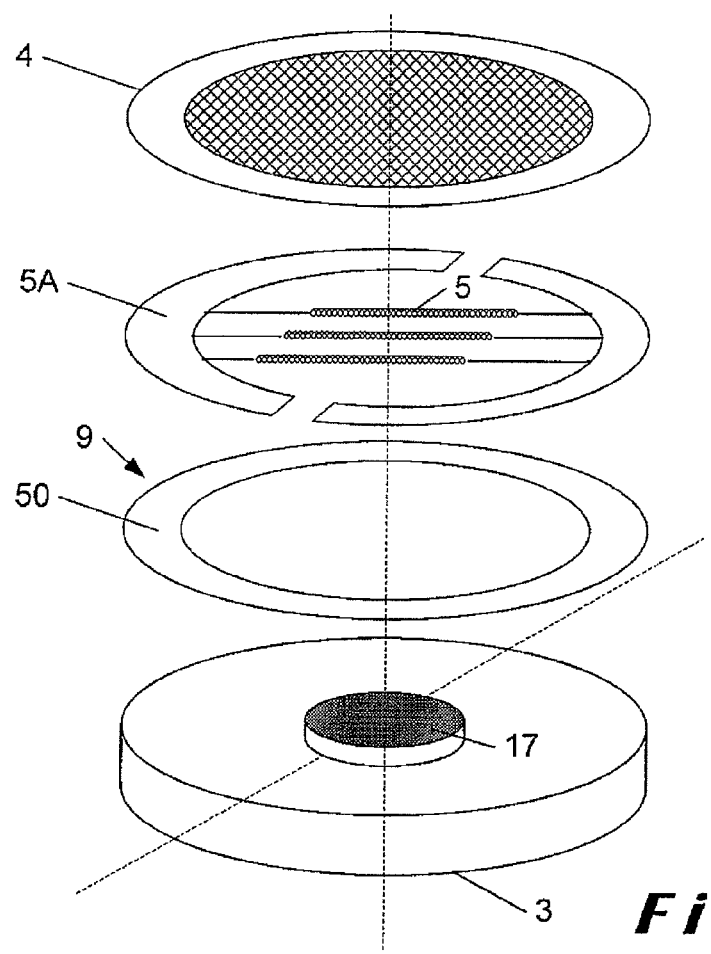
Fig. 10

METHOD FOR SYNTHESIZING A MATERIAL, IN PARTICULAR DIAMONDS, BY CHEMICAL VAPOR DEPOSITION, AS WELL AS DEVICE FOR APPLYING THE METHOD

This is a 371 of PCT/EP11/063,255 filed Aug. 1, 2011, which has a priority of Belgium no. BE2010/0472 filed Jul. 30, 2010, hereby incorporated by reference.

The present invention concerns a method for synthesising a material, in particular diamond, by chemical vapour deposition (CVD), according to which a plasma is created in a vacuum chamber in the vicinity of a substrate arranged to carry the material to be synthesised, and according to which a substance carrying carbon, in particular $CH_4$ or $C_2H_2$, and $H_2$, are introduced into the chamber in order to produce in the chamber a gas comprising substances carrying reactive-carbon atoms in the form of unsaturated molecules or radicals from which the synthesis of said material will be performed.

Such a method is known from the U.S. Pat. No. 4,859,490. According to the known method a vacuum chamber is used, which is maintained at a pressure of between 40 and 400 Torr and in which the substrate is situated. The plasma is created by means of an electrical potential applied between a filament and a grille, said grille being situated between the filament and the substrate. The filament is heated to a temperature of at least 1600° C. and a carbon-carrying gas and $H_2$ are introduced into the chamber to enable diamond to be synthesised from carbon by chemical vapour deposition.

One disadvantage of the known method is that the rate of deposition of the solid material to be synthesised is low, around 1 μm per hour, which means that the procedure, even if it procures synthetic diamond of good quality, is not very profitable from the economic point of view.

The aim of the invention is to produce a method for synthesising a material by chemical vapour deposition, said method making it possible to obtain a higher deposition rate than that of the known method while having good quality of the material.

For this purpose a method according to the invention is characterised in that the electromagnetic absorption and inelastic diffusion spectra of the material to be synthesised are used to take from these spectra the absorption frequencies that contribute to the reactions that lead to the formation of the material to be synthesised, and in that energetic rays are produced in the form of photon beams carrying quantities of energy determined by each of the frequencies corresponding to said absorption and inelastic diffusion frequencies, said photon beam being injected into the plasma where, for energy states of the solid material, an absorption of these photons having the energy corresponding to these energy states is effected by the substances carrying said reactive-carbon atoms. By producing and injecting energetic rays in the form of an energy-carrying photon beam, which on each occasion corresponds precisely to the absorption (intrinsic or activated by default) and inelastic diffusion frequencies (for photons and neutrons), the substances carrying said reactive-carbon atoms present in the plasma created in the chamber can absorb an energy that corresponds suitably to that of the energy states of the material to be synthesised. This therefore makes it possible better to target the energy to be absorbed for synthesising the material that it is wished to obtain. Thus the probability of forming molecules of the material to be synthesised is substantially increased, which affords a rate of deposition of the material to be synthesised that is appreciably higher than that of the known method. In addition, by targeting the energy to be absorbed, the quality of the material to be synthesised is excellent.

Preferably a carbon-carrying gas is introduced as said substance. The addition of a gas is easy to control and affords more effective absorption of the energetic rays.

Preferably, infrared rays are used as energetic rays for effecting a coupling between the energy states of the unsaturated molecules or radicals and the energy states of the photons of the material. These infrared rays cover a wide range of frequencies present in the spectrum of the material to be synthesised. A first preferential embodiment of a method according to the invention is characterised in that the material to be synthesised comprises a crystallographic lattice that determines a set of facies, for example an octahedron, or a dodecahedron in the case of diamond, represented by two sets of directional vectors, the first indicating the directions normal to the main reticular planes, with a higher atomic density determining the possible facies of said material, the second consisting of the wave vectors allowed for propagation of phonons according to the crystallographic structure of the material, said photon beam being oriented and injected in directions indicated by said two sets of directional vectors. In this embodiment the method then consists of injecting photon beams having the energies of the phonon modes ω that are oriented according to corresponding wave vectors K, lying in the Brillouin zone, which are taken from the dispersion curves of said material, for example at the critical points and at the high-symmetry points, including the centre of the zone normally denoted Γ. These two sets of directions, relating to the respective meshes of the direct lattice and the reciprocal lattice, in the end provide the directions chosen for said photon beam. By taking account of these two sets of vectors when the photon beam is injected, the probability of interaction between the photons and the phonons is increased and this thus helps to increase the rate of deposition of the material to be synthesised.

A second preferential embodiment of a method according to the invention is characterised in that a beam of UVC rays is injected into the plasma. The injection of a UVC beam in particular increases the density of the plasma and thus stimulates the synthesis of the solid matter.

A third preferential embodiment of a method according to the invention is characterised in that the plasma is produced by creating an electrical field in the vacuum chamber, said electrical field being created by means of first and second electrical potentials, said first electrical potential is created in a first zone offset in the direction of the height with respect to the substrate and the second electrical potential is created in a second zone situated in the direct vicinity of the substrate, the first and second zones being adjacent to each other, said first and second potentials having a gradient directed towards the substrate, wherein the slope of the first potential is higher than that of the second potential. This makes it possible to better concentrate the substances carrying unsaturated molecules or in the form of radicals all around the substrate and thus to increase the probability of synthesising the material.

The invention also concerns a device for applying the method according to the invention.

The invention will now be described in more detail with the help of the drawings, which illustrate an example embodiment of a device according to the invention. In the drawings:

FIGS. 1a, b and c illustrate schematically the device according to the invention;

FIG. 9 shows an absorption spectrum for diamond obtained by CVD;

FIG. 10 shows an example embodiment of a system for focusing the plasma;

In the drawings the same reference has been attributed to the same elements or to a similar element.

Figure 1A:
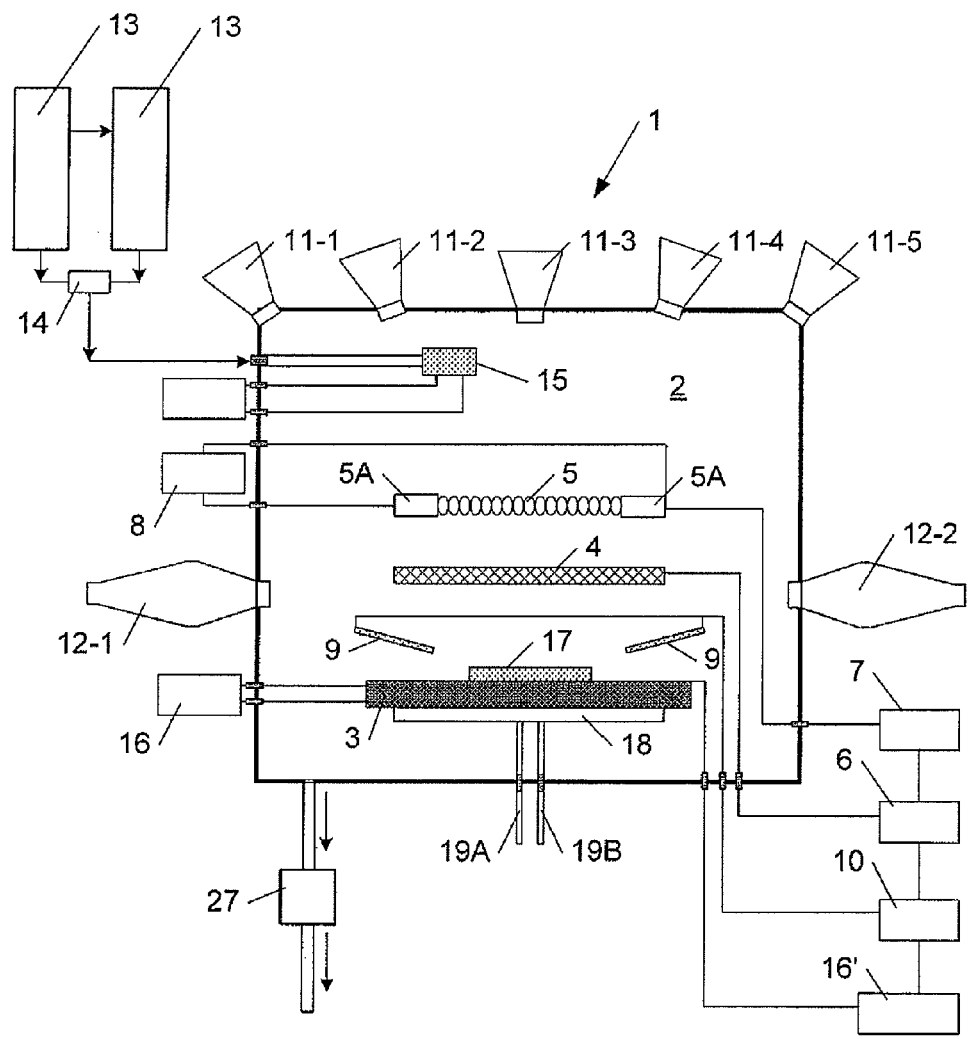
Figure 1B:
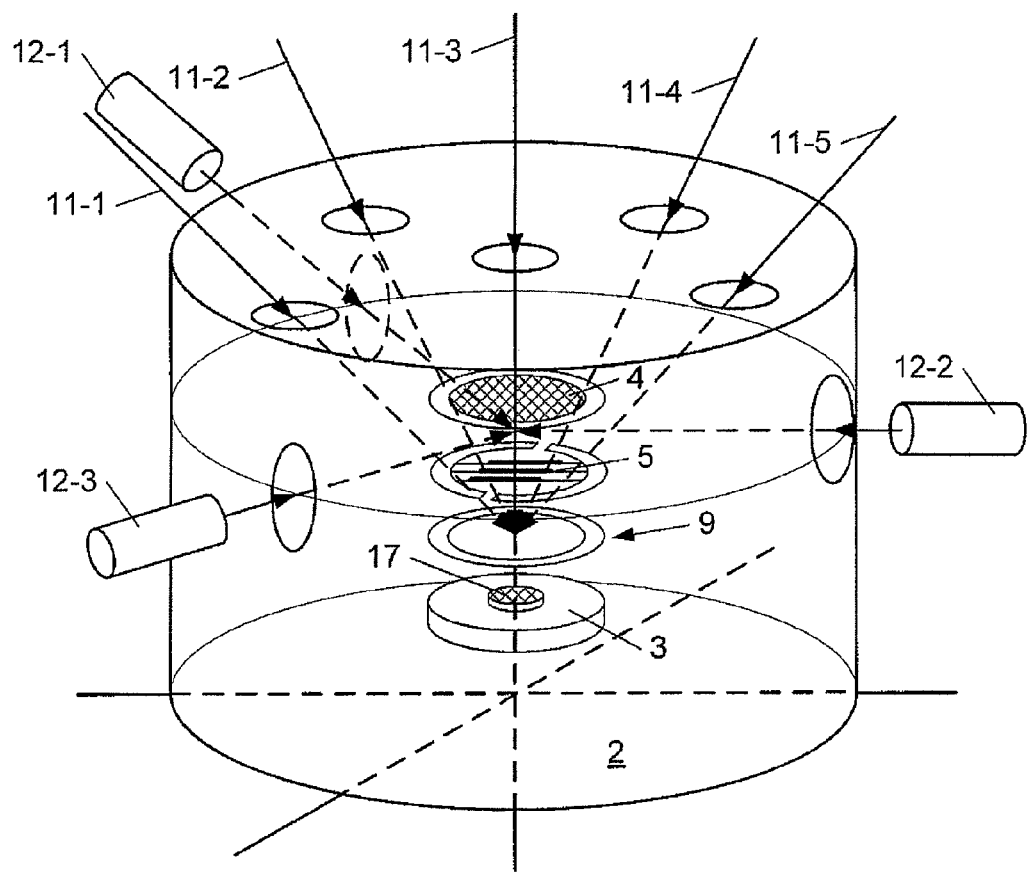

FIGS. 1a, b and c illustrate schematically an example embodiment of a device according to the invention. FIG. 1a shows the structure of the device while FIG. 1b shows the arrangement in space of the elements of the device. The device 1 is arranged for applying a method for synthesising a material by hot filament chemical vapour deposition (HFCVD). It will however be clear that the device illustrated also allows any other method for synthesising a material by chemical vapour deposition (CVD) and that the invention is not limited to the HFCVD process but applies to any CVD process.

The device 1 illustrated in FIGS. 1b and c comprises a vacuum chamber 2, which is preferably brought to a pressure of $10^{-3}$ Torr before starting the synthesis process. The chamber is put under vacuum in a known fashion, for example by means of a pump. In the chamber is a substrate carrier 3, for example formed by a plate, arranged so as to carry the material 17 to be synthesised. This material may be any substance compatible for effecting the deposition, such as for example diamond, W, WCCo, WCNi, silica, etc.

The substrate carrier is preferably connected to a first AC voltage source 16 for reasons that will be described subsequently. Where applicable, the substrate carrier is also connected to a DC source 16'. The substrate carrier 3 is preferably mounted on a cooling plate 18 serving to regulate the temperature of the substrate. For this purpose, an entry 19A and exit 19B for cooling liquid are connected to this cooling plate 18.

Above the substrate is a grille 4 and above the grille a filament 5. The filament is preferably mounted between two collimators 5A that serve to focus the electrical field for better collimation of the plasma. The collimators provide better distribution of the temperature, as well as of the plasma in the deposition region. It should also be noted that the invention is not limited to the position of the grille and filament as illustrated in FIGS. 1a and b, and that these positions may be reversed.

The grille 4 is connected to a second voltage source 6 and the filament 5 to a third voltage source 7. The second and third voltage sources are DC voltage sources. The grille may when necessary also be connected to a fourth AC voltage source (not included in the drawing). The filament is also connected to a fifth voltage source 8 that is an AC voltage source. The first, second and third voltage sources serve to vary the electrical potential between the substrate, grille and filament, while the fifth voltage source 8 serves for heating the filament. By varying the electrical potential between the substrate, grille and filament, it is possible to vary the electrical field in the chamber and thus control the plasma that will be produced in the chamber. The voltage applied to the filament and grille may vary between 0.1 and 400 volts according to the material to be synthesised. The grille serves essentially to regulate the flow of the chemical substances carrying unsaturated molecules or radicals present in the chamber, while the filament serves to activate the gas.

The device according to the invention also comprises a system 9 for focusing the plasma placed at the periphery of the substrate and arranged to improve the distribution of the temperature and plasma in the region where the synthesis of the solid material will take place and where the deposition is effected. FIG. 10 illustrates an example of such a system 9 for focusing the plasma. The plasma-focusing system is for example formed by a ring 50 placed around the substrate and offset towards the top of the chamber with respect to the substrate, The focusing system 9 may also be formed by a set of metal wires bent substantially in the form of an inverted U and placed around the substrate. The plasma-focusing system is supplied by a sixth voltage source 10, which supplies a direct current. The ring form for focusing the plasma in relation to the filament is preferably implemented by two semi-circles placed on either side of the substrate carrier. The plasma-focusing system 9 is preferably placed so as to be inclined towards the substrate carrier in order better to focus the plasma towards the substrate.

Figure 1C:
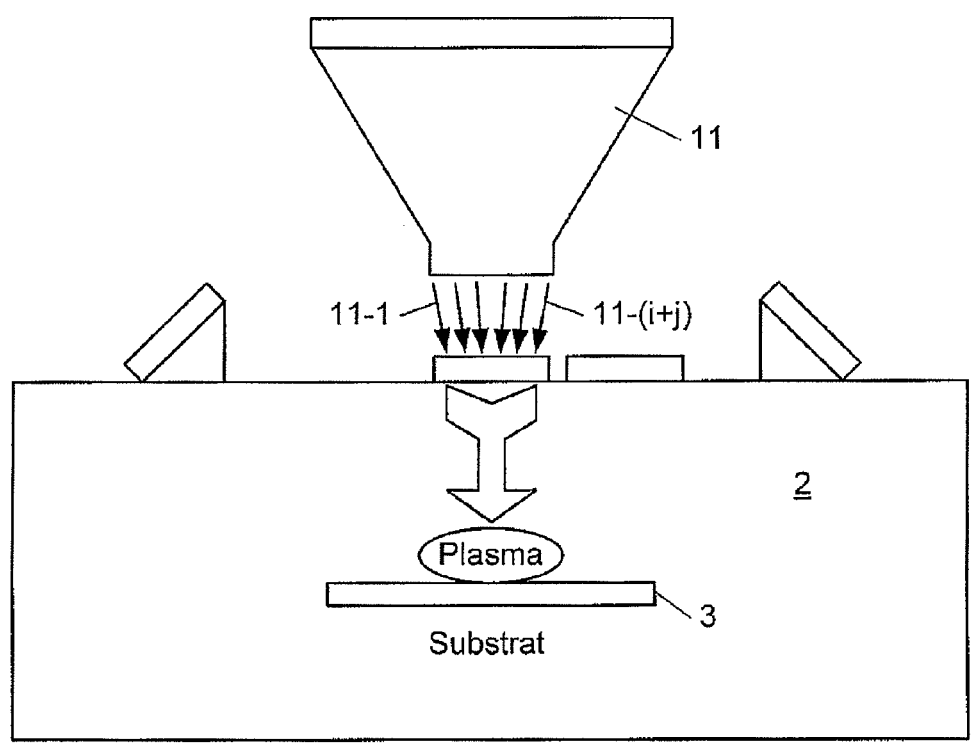

The device according to the invention also comprises photon-beam generators 11-1 to 5 disposed above the chamber and arranged to produce energetic rays, in particular infrared rays (IR), in the form of photon beams. The number of photon-beam generators is determined by the crystallography of the substance and is therefore is not limited to the one set out in FIGS. 1a and b. It is also possible, as in the embodiment illustrated in FIG. 1c, that there may be only one photon-beam generator. This or these generators serve to produce energetic rays the frequency of which is determined by the spectral density function $\psi(\omega, K)$ of the material to be synthesised, where $\omega$ represents the frequency and K the wave vector, which is polarised or not in a plane, as will be described below. Finally, the device is provided with a generator 12-1, 12-2 and 12-3 (the latter not being visible in the drawing) generating beams of UVC rays. The latter generators are preferably arranged in a circle, with in each case an angle of 120° between them for reasons of symmetry.

It should be noted that, for reasons of clarity, only the embodiment of the photon-beam generators arranged to produce infrared rays will be described. However, the invention is not limited to this embodiment and other energetic rays of the electromagnetic spectrum that interact with the material may be used (X-rays, UV, visible).

Since a plasma must be produced inside the chamber 2, the device according to the invention also comprises an entry connected to a supply source 13 for introducing into the chamber a carbon-carrying substance, in particular in the form of a carbon-carrying gas, and hydrogen ($H_2$). The substance that is introduced is of course related to the material to be synthesised. The source is connected to the chamber by means of a flow control valve 14 arranged to regulate the flow rate of the gas injected into the chamber. For forming diamond, the carbon-carrying substance is introduced into the chamber in order to produce therein a gas comprising substances carrying reactive carbon atoms in the form of unsaturated molecules or radicals from which the synthesis of the material will be effected. The carbon-carrying gas is for example methane ($CH_4$) or acetylene ($C_2H_2$). This synthesis reaction is known per se and is for example described in the article by J E Butler, Y A Mankelevich, A Cheesman, Jie Ma and M N R Ashfold entitled "Understanding the chemical vapour deposition of diamond: recent progress", which appeared in Journal of Physics Condensed Matter 21, 2009. Where necessary the gas may be preheated by means of heating 15 before entering the chamber. A gas-pumping unit 27 is connected to the chamber in order to pump the gas and balance the pressure of gas prevailing inside the chamber. For forming a material other than diamond, the substance necessary for forming said material is introduced into the chamber in order to produce therein a gas comprising substances carrying base atoms of the reactive material in the form of unsaturated molecules or radicals from which the synthesis of the material will be effected.

The deposition zone is situated in the vicinity of the substrate. It is in the deposition zone that the synthesis reaction takes place and it is for this reason that, in the deposition zone, the temperature distribution and the distribution of the chemical species to be activated must be very homogeneous.

The method according to the invention is based on the physical phenomenon of resonance during the selective excitation and the coupling of the specific quantum states of the active chemical species and the specific quantum states of the material to be synthesised. This material to be synthesised may be either a solid material, a liquid or even a gas. The objective of the invention is to increase the efficiency of the synthesis method by allowing selective transitions at the quantum state level. The method according to the invention assists the probability of the formation by synthesis of a material by imposing some of the specific quantum states, which correspond to the effective or apparent absorption spectrum of this material during the reaction steps and which lead to the formation of the material.

The method according to the invention also promotes the probability of the formation of a chemical species by imposing certain specific quantum transitions corresponding to the material to be synthesised. Finally, the method promotes the probability of formation of a chemical species by imposing certain specific quantum states of the chemical species to be synthesised on the reaction steps during the formation corresponding to said chemical species.

In the method according to the invention, energies ($E^{DA}_{st}$), which may act at various moments in the reaction, or during the entire reaction, are introduced into the chamber. Thus there are:

$E^{D}_{st}$: which is a dissociation energy the function of which is to rupture some of the chemical bonds present in the substance and to form selectively, in particular by resonance, starting substances or transient substances that should then lead to the material to be synthesised. The dissociation energy is for example produced by UVC rays.

$E^{A}_{st}$: which is a structuring energy, forming, aggregating or configuring the structure to be formed: its function is to fix the structure of the substance to be formed or synthesised.

The spectral density function [$\psi(\omega,K)$] of the material to be synthesised is composed of a sum of functions of the state spectral densities $$\psi(\omega,K)=\psi_E(\omega,K)+\psi_V(\omega,K)+\psi_R(\omega,K)+\psi_T(\omega,K)$$

where $\psi_E$ represents the electron state spectral density function, $\psi_V$ the vibrational or phonic state spectral density function, $\psi_R$ the rotational state spectral density function and $\psi_T$ the translation state spectral density function. Fuller details on this state spectral density function for an example of diamond corresponding to the vibrational states are described in the article by Claude Klein, Thomas Hartnett and Clifford Robinson, entitled "Critical-point phonon frequencies of diamond", which appeared in Physical Review B, Vol 45, No 22 of 1 Jun. 1992. In particular, for diamond, the global state spectral density function is described by the sum of the spectral density functions of the electron ($\psi_E(\omega,K)$) and vibrational ($\psi_V(\omega,K)$) state spectral density functions. When the material is formed by a liquid, the rotational states must be taken into account and, for a gas, the translation states must be taken into account.

The method according to the invention has recourse to this state spectral density function or failing this to the effective or apparent electromagnetic spectrum of absorption of the material to be synthesised, see, for the example of diamond, the absorption spectrum set out in FIG. 9 of the article by Klein et al. These electromagnetic absorption spectra are spectra intrinsic to the material, or activated by default. These electromagnetic absorption spectra are also inelastic diffusion spectra of photons or neutrons of the material to be synthesised. The absorption frequencies ($f_i$) that characterise the material to be synthesised and thus contribute to the reactions that lead to the formation of the material to be synthesised are taken from the electromagnetic absorption spectrum.

Thus, for example still referring to the article by Klein et al, the 17 $1 \leq i \leq 17$ energy levels set out in table II are taken, corresponding to the two-photon spectrum (and (or) table I of the same article corresponding to the one-photon spectrum). By means of these energy levels and the absorption frequencies that correspond thereto, a photon beam carrying a quantity of energy $E_i = hf_i$ where h is equal to Planck's constant, will be formed for each (i) of these frequencies $f_i$. In this way, in the example of diamond, seventeen photons beams are obtained, each having a well determined quantity of energy $E_i$. Naturally the number of frequencies depends on the solid material to be synthesised. The choice of i=17 is related to the example of the article by Klein et al, but in no way limits the invention.

Naturally all the frequencies of the spectrum of the material to be synthesised set out in FIG. 9 of said article could be taken. However, in practice, it suffices to take the most representative ones and those necessary for determining the material. Thus the values set out in table III of the article by R Vogelgesang, A Alvarenga, Hyunjung Kim, A Ramdas and S Rodrigues entitled "Multiphonon Raman and infrared spectra of isotropically controlled diamond", which appeared in Physical Review B, Volume 58, number 9 of September 1998 on pages 5408 to 5416, could be taken. However, as this table shows, not all the energy levels have an activity in the infrared frequency range and it is therefore not useful to produce a photon beam for those frequencies that have not been activated.

The energy contained in each photon beam therefore represents the excitation energy of phonon modes specific to the material to be synthesised. Thus the substances carrying reactive carbon atoms present in the plasma, which come into contact with the photon and have an absorption frequency corresponding to that of the photons of the beam, will, when it is a case of a solid material to be synthesised, undergo vibrational transitions, which will have an influence on their interaction with the substrate (or with the solid already formed). Since the energy of the photons corresponds to that of the phonic states of the material to be synthesised, the result will be a more effective interaction and a reaction more targeted to the surface of said material, which will give rise to a greater efficiency of the method compared with the method already known, where the energy is distributed over all the frequencies non-selectively (electron, vibrational, etc.). The method according to the invention has recourse to the phenomenon of interaction, in the interphase of the material and the substances carrying reactive-carbon atoms, by means of the photons, for an optimum coupling of the two systems.

These photon beams are injected into the plasma present in the chamber 2 by means of the generators 11-$i$. The energy taken up in each photon beam therefore represents the energy necessary for causing an absorption by resonance at the phonic state level. Thus the substances containing reactive carbon atoms present in the plasma which come into contact with the photons the absorption frequency of which corresponds to that of the energy in the photon beam will absorb this energy, thus resulting in a more advantageous synthesis reaction of the solid material to be formed. Since the energy of the photons corresponds in each case to that of the phonic states, a more targeted reaction, having a greater probability of leading to an absorption of the energy of the photons will be caused, which will therefore give rise to a greater efficiency of the method compared with the known method where the energy covers all the frequencies non-selectively.

Figure 2:
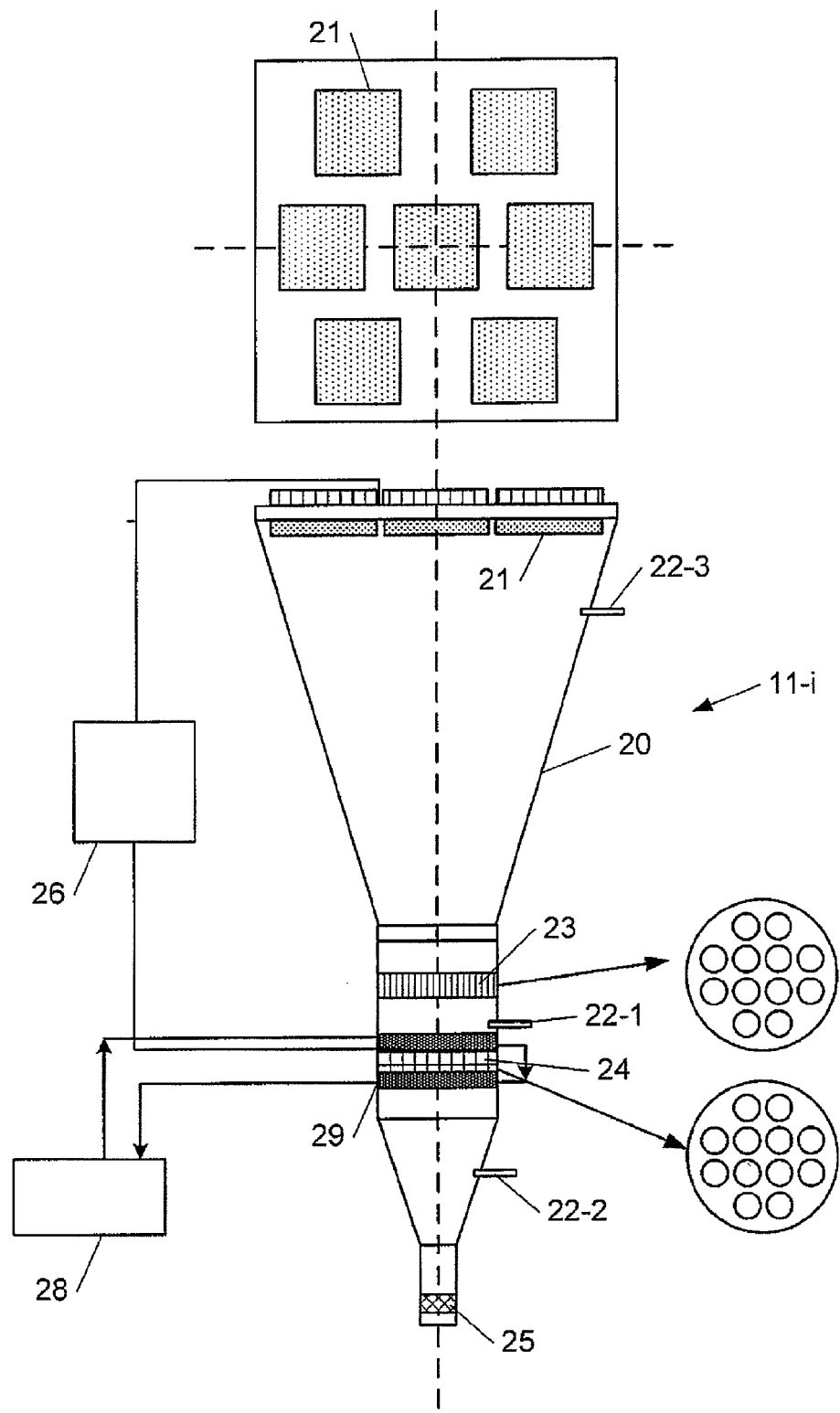
FIGS. 2 and 3 show emitters for producing the photon beam.

FIG. 2 shows an example embodiment of an emitter (11-$i$) generating a photon beam. This generator produces a photon beam having the energies $E_i$ corresponding to the chosen absorption frequencies $f_i$. The generator comprises a body 20, preferably manufactured from copper to give high efficiency. This body has a frustoconical shape and comprises at its head a set of ceramic heating plates 21 forming an infrared (IR) emitter. In the example illustrated the generator comprises seven plates distributed over the entire surface and shown in the top part of the figure. The generator also comprises gas inlets 22, for example for argon. This gas serves to reduce the oxidation of the internal wall, which in turn makes it possible to maintain a high reflective index for it. The gas also reduces the absorption of the infrared rays produced and contributes to the generation of the photon beam having very selective energy quantities. Where necessary a pump 28 is provided for circulation of the liquid in a cooling system 29.

A first set of filters 23 with a wide passage band is mounted close to the entrance to the frustoconical tube. These filters are for example formed by sapphires. Instead of using a set of filters it is also possible to use only one filter; however, the latter solution is more expensive. This set of filters makes it possible to select the frequency of the energy to be produced. A second set of filters 24 with a narrow passage band is mounted below the first filter so that the first and second sets of filters are situated on either side of the gas inlet 22-1. This second set consists of multi-passage optical filters for selecting all the frequencies $f_i$ necessary for the synthesis reaction. At the end of the generator there is an optical lens 25 that serves as a collimator for the photon beam. An electric current supply source 26 coupled to a regulator controls the temperature of the emitter.

Thus, to operate the photon beam generator, the frequency of the energy to be produced is supplied by means of the first and second sets of filters 22 and 24. The photons are produced by the emitter 21 and the required energy $f_i$ is obtained by adjusting the sets of filters 23 and 24. Thus a photon beam having an energy $E_i=hf_i$ for the frequency $f_i$ selected emerges from the second set of filters 24. The presence of several generators 11-$i$ makes it possible to generate several energy beams $E_i(f_i)$ simultaneously.

Figure 12:
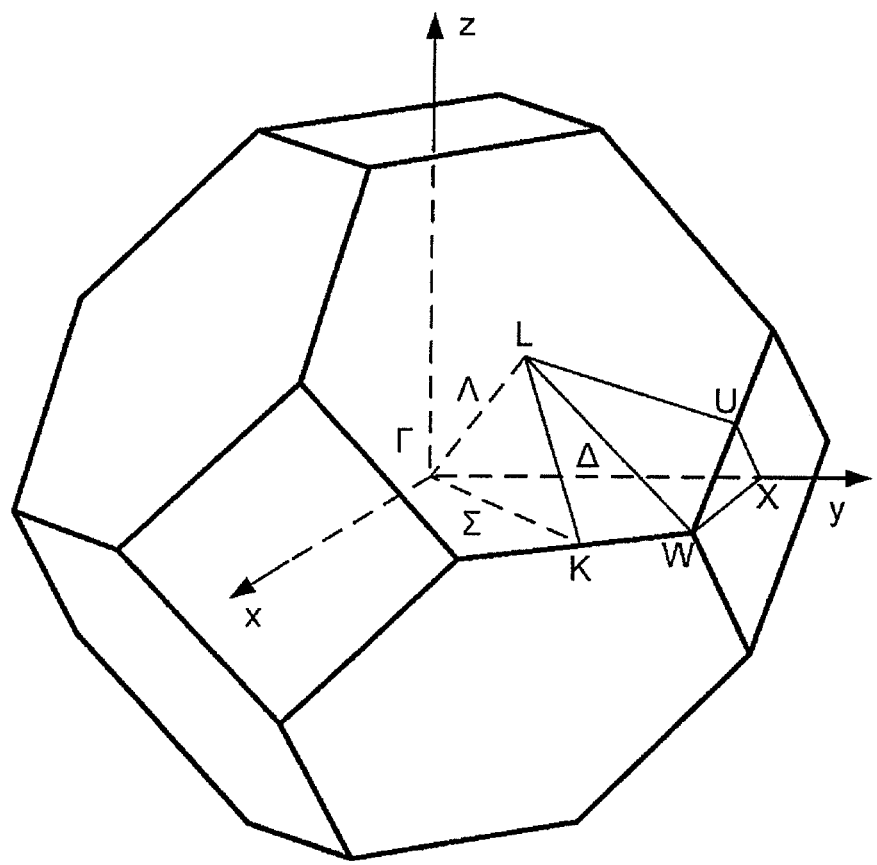
FIG. 12 illustrates the first Brillouin zone of the mesh of a material such as diamond.

The material to be synthesised has a crystallographic mesh with which two sets of directional vectors can be associated. The first set of vectors indicates the directions normal to the principal recticular planes with the highest atomic density determining the possible facies of said solid material, for example, in the example of diamond, the octahedron or dodecahedron. The second set of wave vectors consisting of the wave vectors permitted for the propagation of phonons in accordance with the crystallographic structure of the material. This is for example described in more detail in the article by A Ramdas entitled "Raman, Brillouin and infrared spectroscopy of photons in conventional diamond" published in IEE of July 2000. FIG. 12 illustrates the first Brillouin zone of the mesh of a material such as diamond with the high-symmetry points $\Gamma$, L, X, W, $\Sigma$, $\xi$.

Said photon beam is oriented and injected in directions indicated by said two sets of directional vectors. The method also consists of injecting photon beams having the energies of the phonon modes $\omega$ and oriented according to the corresponding wave vectors K, lying in the Brillouin zone, which are taken from the dispersion curves of said solid matter to be synthesised, for example at the critical points and at the high-symmetry points, including the centre of the zone normally denoted $\Gamma$. These two sets of directions relating to the respective meshes of the direct lattice and the reciprocal lattice in the end provide the directions chosen for said photon beam. Taking account of these two sets of vectors, when the photon beam is injected, it is possible to increase the probability of interaction and this thus helps to increase the deposition rate of the solid material to be synthesised.

To increase the efficiency of the synthesis it is useful to take account of this crystallography and to inject the photon beams in the directions indicated by the normal to the crystalline faces and (or) also the directions corresponding to the wave vectors allowed for the propagation of phonons. It should be noted that, though this way of proceeding at the method according to the invention improves the injection of photons described above, the injection can also be done directly without taking account of these favoured directions. The generators are mounted directionally on the chamber in order precisely to allow this possibility.

Figure 3:
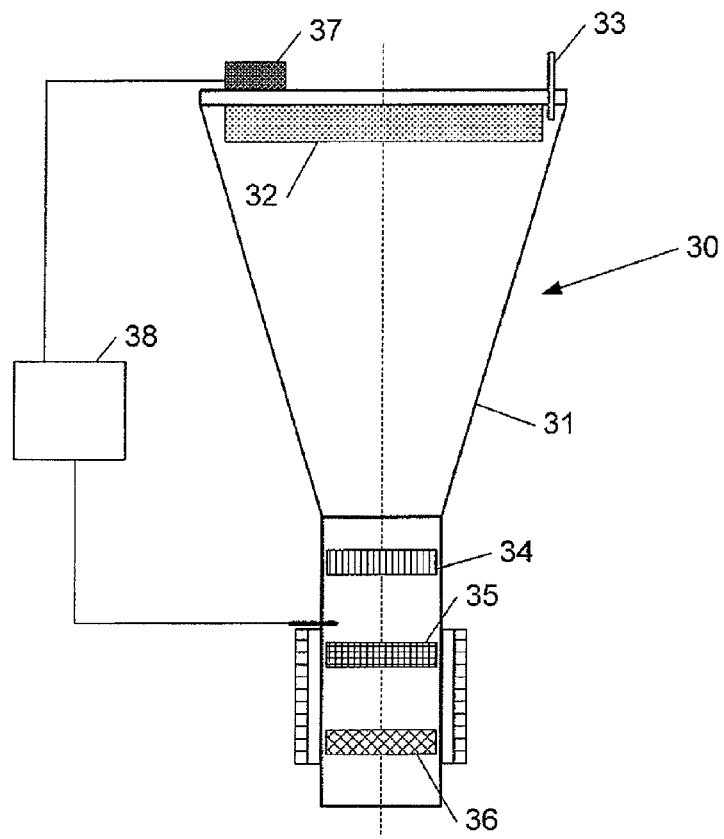

FIG. 3 illustrates another example embodiment of a single-frequency generator 30 generating a photon beam. This generator comprises an emitter body 31 that is also preferably made from copper to provide a high reflective index for the photons. A ceramic heating plate 32 having a narrow emission band is mounted in the top part of the body having a frustoconical shape. A gas inlet 33 is also provided on the top part. This gas fulfils the same role as that described in the example in FIG. 2.

The generator comprises a first set of filters 34 with a wide frequency band that allows pre-selection of the frequency value corresponding to $f_i$ by reducing the bandwidth. At the same time, this first filter facilitates the reduction of the heat produced in the generator. A second set of filters 35 with a narrow passage band makes it possible to select the required frequency $f_i$ and an optical lens 36 allows collimation of the photon beams. Finally, the power supply 37 supplies electric current and a regulator 38 regulates the temperature.

Figure 4:
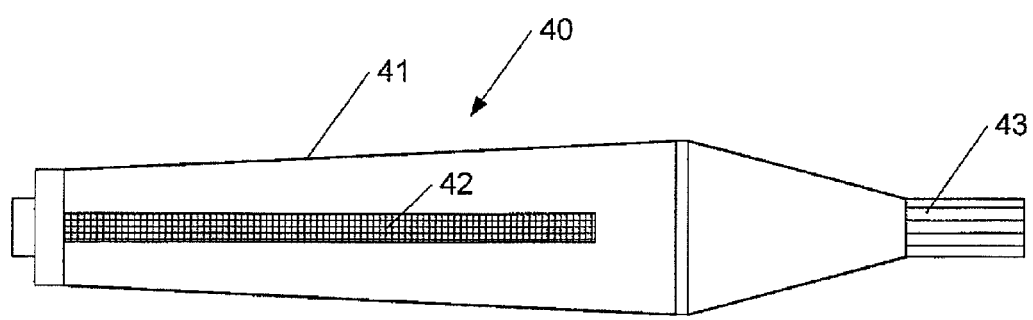
FIG. 4 illustrates an emitter for producing UVC.

In order further to stimulate the synthesis of the material, it is important that there be sufficient unsaturated molecules or radicals present in the plasma. This is because these unsaturated molecules or radicals are bricks essential to the deposition of the material. To this end, the method according to the invention comprises the production of beams of UVC rays that are then injected into the plasma. FIG. 4 illustrates an example embodiment of such a generator (40) of UVC rays. This generator comprises a body 41, preferably fabricated from aluminium to afford a high reflective index for the UVC rays. A UVC lamp 42 is mounted inside the body 41. This lamp produces UVC rays, which are sent to a collimator 43 in the form of a funnel. The emitter of UVC rays is preferably placed on a lateral side of the chamber to allow direct injection into the plasma. The UVC rays thus stimulate the reaction $CH_4 \rightarrow CH^+_3 + H^-$, which thus causes a greater concentration of $CH^+_3$ that will contribute to the synthesis of the required material.

To further increase the efficiency of the deposition by synthesis of the material, use is made of a plasma-focusing system. FIG. 10 shows a first embodiment of such a system. Peripheral to the substrate carrier 3 and offset in height with respect to the substrate 17, a ring 50 is placed in the chamber. The ring is situated below the filament 5 and is connected to an electric current supply source. A second embodiment of a plasma-focusing system can be implemented by replacing the ring in FIG. 10 with an electrical conductor configured as a succession of block waves disposed at the periphery of the substrate carrier 3. Both the ring 50 and the electrical conductor produce an electrical field directed towards the substrate that will focus a plasma present in the chamber towards the substrate. The plasma-focusing system is situated between the grille 4 and the substrate 3.

The method according to the invention will now be illustrated by means of FIGS. 5 to 8 and 11. The grille 4 and the filament 5 make it possible to create a first electrical potential in a first zone RFG offset in the direction of the height with respect to the substrate. This first zone is situated in the vicinity of the grille 4 and filament 5. The plasma-focusing system creates a second electrical potential in a second zone RD situated on the surface of the substrate carrier 3. The first and second zones are adjacent to each other so as not to create, so to speak, a vacuum between the first and second potentials. In the chamber there is also a zone RPF of the plasma around the filament 5. In the first zone RFG the plasma is established by the difference in potential between the filament and the grille. In the zone RGC at the periphery of the substrate, the plasma is established by the difference in potential between the grille and the focusing system 9, whereas in the zone RCS, below the focusing system, the plasma is established by the difference in potential between the focusing system and the substrate carrier.

Figure 11:
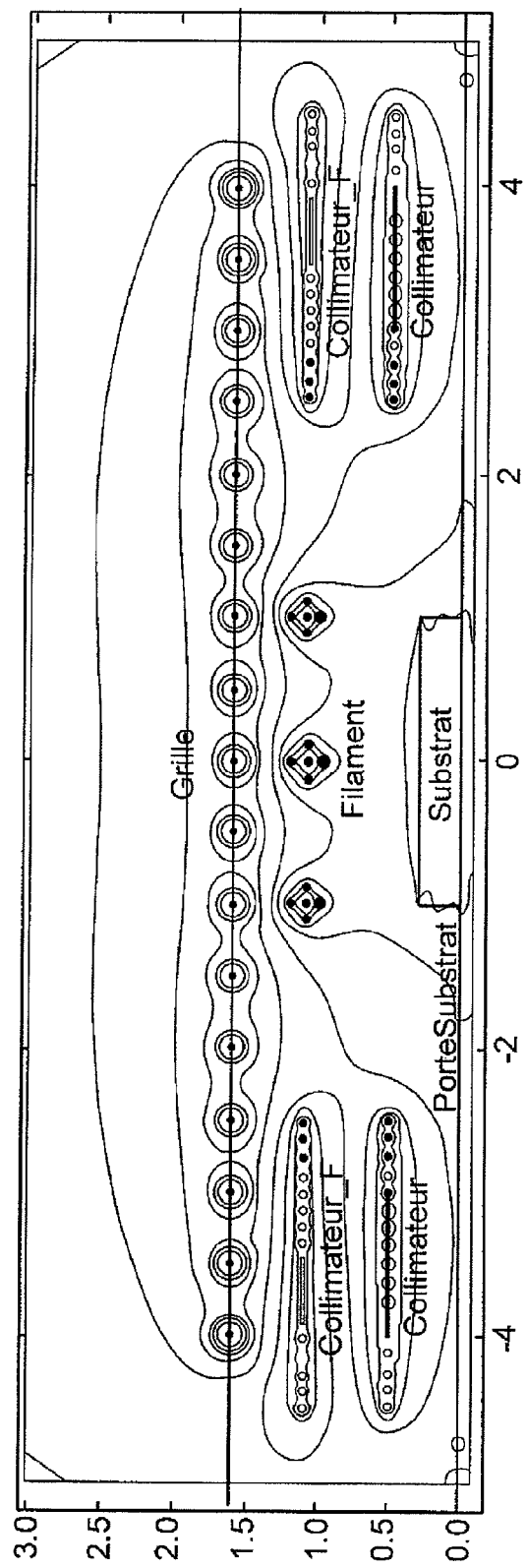
FIG. 11 shows first and second potentials.

Because of their different configuration and technical design, the first and second potentials each have a different gradient. Even if the two electrical fields that provide the potentials are directed towards the substrate, the gradient level of the first potential is higher than that of the second potential. FIG. 11 shows the distribution of the electrical field in the chamber. To facilitate understanding, the grille 4, the filament 5 and the substrate 3 have been repeated in this FIG. 11. In this figure it can be seen how the potential is concentrated around the substrate, thus creating a potential well in which the substrate is situated. It can be seen in fact that, around the filament, the potential is concentrated so as to extend above the substrate carrier. Thus the deposition by synthesis of the material will be promoted in this region of the substrate. Around the grille it can be seen that the electrical field has a configuration in an oval loop. In the example set out in FIG. 11, the voltage on the grille is 185 V, on the filament −25 V and on the substrate carrier −0.1 V, and the focusing system is at 20 V. It can also be seen how the potential produced by the focusing system tends to concentrate the plasma around the substrate carrier.

The method according to the invention will now be illustrated in more detail with the help of FIGS. 5 to 8. In the chamber 2 a plasma 60 is created as described previously and the gas is introduced into the chamber by the supply source 13. The values of the first and second potentials will be established according to the material to be synthesised.

Figure 5:
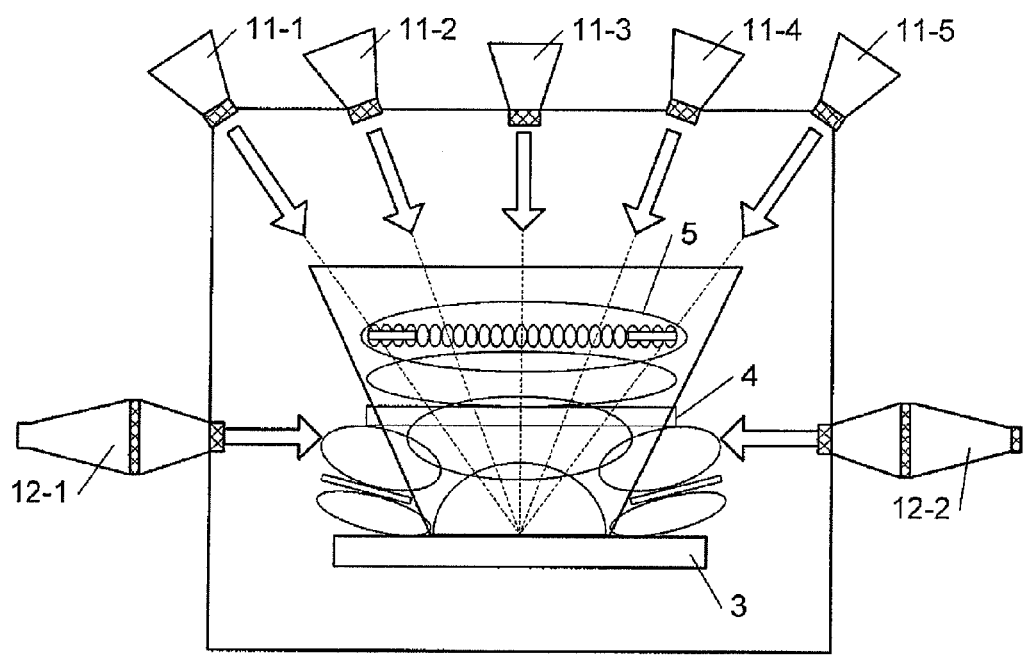
FIG. 5 illustrates the method according to the invention as it occurs in the device.
Figure 6:
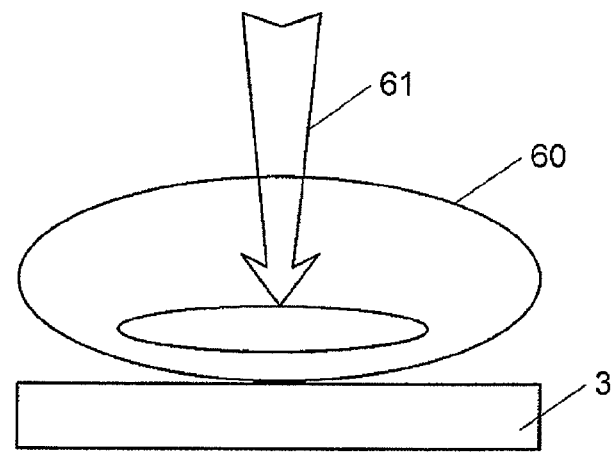
FIGS. 6 to 8 show steps of the method.
Figure 7:
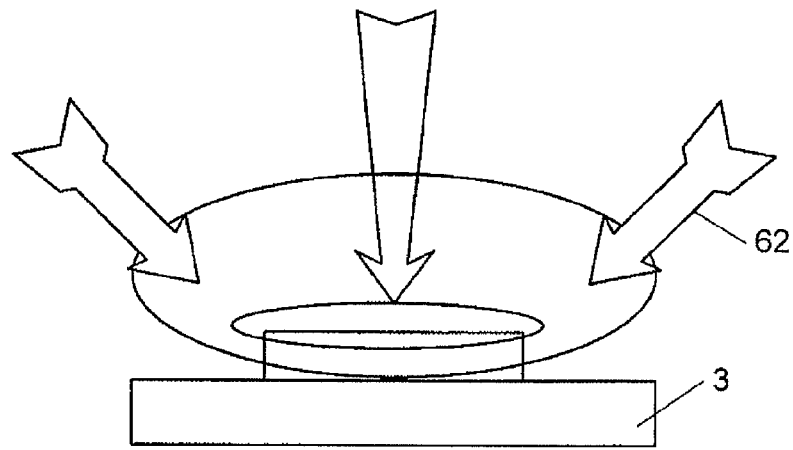
Figure 8:
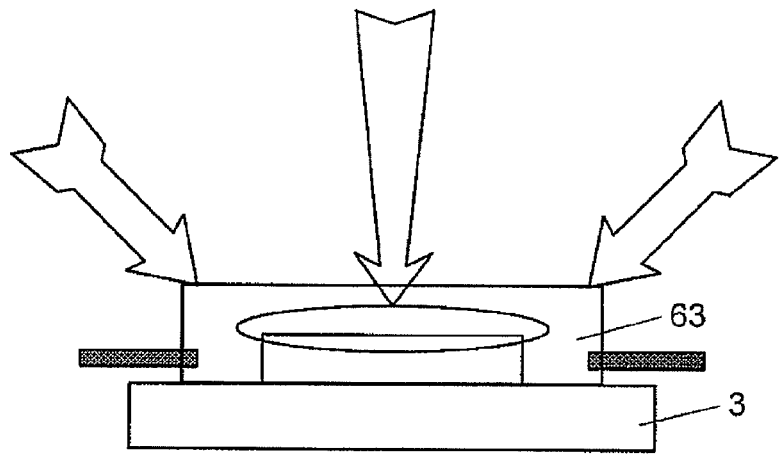

On the basis of the spectral distribution function or failing that its absorption spectrum of the material to be synthesised, the user will determine the various absorption frequencies $f_i$ in order to be able, by means of the generators 11, to produce photon beams 61 having the energies $E_i = hf_i$ necessary for the synthesis of the material. FIG. 5 illustrates how in the zone RI the energetic rays are introduced into the chamber. Where applicable it is possible to polarise the rays that are introduced into the chamber. In the latter case the direction of the wave vector associated with the frequency value and the polarisation plane of the wave vector associated with the crystallography of the material are taken into consideration. The energy thus produced will be injected into the plasma, where it will be able to be absorbed by the substances carrying the reactive carbon atoms present in the plasma. Since close to the substrate and to the surface thereof the plasma is focused, a better energy interaction between the substances carrying the reactive carbon atoms and the substrate, where the material already formed is present, will be obtained.

An improvement can be obtained by activating the UVC ray generators 17 which will selectively excite the substances contained in the plasma. This makes it possible to increase the production in the plasma of a selective form containing unsaturated molecules or radicals and thus to increase the probability of energy absorption. These UVC rays are introduced into the zone RAS, that is to say into the zone of the grille. For the example of diamond, the 17 frequency values are injected into the plasma according to the set of vectors L, W, $\Sigma$ and $\xi$. Four beams in the direction of the vector L, three beams in the direction of the vector W, seven beams in the direction of the vector $\Sigma$ and three beams in the direction of the vector $\xi$. Finally, by means of the focusing system, it is possible to form a plasma well 63 around the substrate carrier (zone RD) in order thus to focus the substances containing reactive-carbon atoms around the substrate.

The invention is of course not limited to the synthesis of diamond and may be applied to other materials to be synthesised. Thus, for example, the method according to the invention is applicable to the doping of diamond with boron in order to produce a superconductor. The condition for obtaining a superconductor is that the density of the atoms $n_B > 3 \times 10^{20}$ atoms/cm$^3$ (>600 ppm). In order obtain a superconductor the method according to the invention is at the start similar to that described for synthesising diamond. For effecting the doping of the diamond with boron, a gas carrying boron is introduced into the chamber, for example trimethylborane or boron trichloride or diborane, in particular diborane ($C_2H_6$) in a proportion of 0.01-200 ppm with respect to the $H_2$, more particularly 1 ppm to 20 ppm. This boron-carrying gas is for example introduced when the layer of diamond already has a thickness of at least 1 µm, in particular approximately 1 to 5 µm. A second photon beam at the frequency corresponding to the electron-photon interaction that causes superconductivity is also injected into the chamber after the physico-chemical synthesis by resonance of the diamond. In particular, the second photon beam is divided into first and second fragments of the second beam and the two fragments of photon beams corresponding to the photon frequency due to the presence of boron and which leads to the appearance of superconductivity are injected into the plasma. More particularly the first fragment of the second photon beam in the direction LO_($\Gamma \to L$ and $\Gamma \to \xi$), and the second fragment of the photon beam in the direction of the set of directional vectors L, W, $\Sigma$, $\xi$ with an offset of 4 mV with respect to the value of the non-doped diamond. Fuller details on the phonon mode LO are set out in the article by M Hoesch et al entitled "Discovery of phonons causing superconductivity in diamonds looking for room temperature—superconductors in diamonds" which appeared in JAEA R&D Review 2007, page 45.

A possible reduction in the power of the various photon beams corresponding to the deposition of diamond can be envisaged, proportional to the difference in energy for the bonds of type B—C with respect to C—C. This reduction makes it possible for the growth of the diamond not to dominate the formation of the superconductivity and thus facilitates or weights the process of replacement of carbon (C) by boron (B).

Another application of the method according to the invention consists of doping diamond with boron in order to produce a type p semiconductor. One condition for obtaining a semiconductor is that the density of the atoms is $n_B < 1 \times 10^{20}$ atoms/cm$^3$ (<600 ppm). A boron-carrying gas is used similar to that used for forming the superconductor but with a quantity of 0.01-100 ppm with respect to the $H_2$, in particular 0.1 ppm to 10 ppm. A third photon beam at the frequency corresponding to the electron-phonon interaction that causes semiconductivity is also injected into the chamber after the physico-chemical synthesis by resonance of the diamond. In particular, the third photon beam is divided into first and second fragments of the third beam and the fragments of photon beams corresponding to the phonon frequency due to the presence of the boron and which leads to the appearance of semiconductivity are injected into the plasma. Thus the five photon beams corresponding to the frequency of the phonons due the presence of boron, responsible for semiconductivity, are injected into the plasma. The first fragment formed from three beams that are injected in the direction L and the second fragment comprise two beams that are injected in the direction $\xi$, of the set of directional vectors L, W, $\Sigma$, $\xi$. Just like for the production of superconductors, a possible reduction in the power can be envisaged.

Yet another application of the method according to the invention consists of doping diamond with nitrogen (N) in order to produce a type n semiconductor. One condition for the obtaining of a semiconductor is that the density of the atoms is 25 to 2500 ppm. A nitrogen-carrying gas is used, such as for example $N_2$, $CH_3$ or $CH_3NH_2$, in particular $N_2$, with a ratio of 0.1 to 1 of $N_2$ with respect to $CH_4$. Photons at the frequency corresponding to the electron-phonon interaction that causes type n semiconductivity are also introduced into the chamber after the physico-chemical synthesis by resonance of the diamond. In particular the photon beams corresponding to the phonon frequency due to the presence of nitrogen for the type C centre, and (or) the three photon beams corresponding to the phonon frequency due to the presence of nitrogen for the type A aggregate, and (or) the four photon beams corresponding to the phonon frequency due to the presence of nitrogen for the type B aggregate are in particular injected into the plasma according to the set of directional vectors. Just as for the production of type p semiconductors, a possible reduction in the power can be envisaged.

The method according to the invention also makes it possible to dope the diamond with phosphorus in order to produce a type n semiconductor. A phosphorus-carrying gas is used, such as for example phosphane ($PH_3$) with a phosphorus/carbon mol ratio of $4*10^{-2}$ to $4*10^{-5}$, in particular $2*10^{-2}$ to $1*10^{-3}$. A fourth photon beam at the frequency corresponding to the electron-phonon interaction that causes type n semiconductivity is also introduced into the chamber after the physico-chemical synthesis by resonance of the diamond. In particular the photon beams located at 523 meV and 562 meV and corresponding to the phonon frequency due to the presence of phosphorus in the crystalline lattice and responsible for semiconductivity are injected into the plasma according to the set of directional vectors. A possible reduction in the power can be envisaged.

The method according to the invention also makes it possible to form by doping a semiconductor of the Si—Ge (silicon germanium) type. It should be noted that, in the example of doping of Si by Ge, the epitaxy of Ge on Si and the formation of an alloy of the $Si_{1-x}Ge_x$ type in the CVD process, leads to the appearance of tension in the interface and inside the crystal due to the difference between the constant of the Si lattice and that of Ge. These tensions are a source of defect in the crystalline structure. Thus generally heteroepitaxy of Ge on Si begins with the appearance of islands of Ge on the Si. These islands are in the form of a pyramid and peaks that may lead as far as the formation of aggregates of Ge. This has a consequence of forming a non-homogeneous deposit.

A deposit of Si and Ge is currently considered of high quality if the density of defects due to the appearance of such deformations is smaller than 0.3 particles/cm$^2$ with a low density of dislocations smaller than $10^6$/cm$^2$. The method according to the invention makes it possible to form an Si—Ge deposit that will have fewer imperfections as described and which may even eliminate them. To this end the method for a deposition of Si—Ge comprises:

(a) a step of chemical vapour deposition (CVD) of silicon on a pure silicon substrate or on a blank substrate, at a temperature of between 500° C. and 600° C., preferably at a temperature (T0) of 500° C., in the presence of hydrogen. The pressure in the chamber is preferably 0.01 mbar to 1000 mbar, in particular 0.1 mbar to 1000 mbar, more particularly 1 mbar to 800 mbar. As a silicon precursor gas use is made of $SiH_2Cl_2$, $SiHCl_3$, $SiCl_4$ or $Si(CH_3)_4$, in particular $SiH_4$, until a thickness of layer of 3 nm to 5 nm preferably is obtained. A mixture of one or more of these precursor gases may also be envisaged. To obtain a higher deposition rate and a deposition with a quality superior to that of the basic method, the photon beam corresponding to the frequency of the phonon due to the Si—Si bond is injected into the chamber while pointing towards the substrate and according to the set of directional vectors L, X, $\Sigma$, $\xi$. After having obtained the desired thickness of layer the addition of $SiH_4$ is stopped, and the temperature of the photon beam is reduced to 400° C. to 550° C., preferably to 430° C. to 460° C., in the presence of hydrogen. The pressure in the chamber is preferably 0.01 mbar to 1000 mbar, in particular 1 mbar to 800 mbar;

(b) a step of stabilisation of the temperature of the substrate at a first temperature (T1) from 400° C. to 550° C., preferably 430° C. to 460° C., more particularly 450° C., in the presence of hydrogen. The pressure in the chamber is preferably 0.01 mbar to 1000 mbar, in particular 1 mbar to 800 mbar;

(c) a step of chemical vapour deposition (CVD) of germanium at the first temperature, referred to as T1, on the pure silicon substrate or on the silicon substrate already obtained after CVD of silicon, until a predetermined thickness of layer of germanium is obtained, or a desired final layer thickness obtained on the layer of silicon, the germanium precursor gas is preferably $GeH_4$. The photon beam corresponding to the frequency of the phonon due to the Ge—Ge bond and the photon beam corresponding to the frequency of the phonon due the Si—Ge bond is then injected into the chamber while pointing to the substrate, according to the set of directional vectors L, W, $\Sigma$, $\xi$. The latter beam will act during the formation of the first atomic layers of Ge, that is to say during the formation of the Si—Ge interface. Subsequently the power of the photon beam corresponding to this bond (Si—Ge) will be reduced, or even decreased to zero, but while maintaining the power of the photon beam corresponding to the Ge—Ge bond. This will make it possible to obtain a reduction in the number of defects in the deposition, that is to say to obtain a deposition with a superior quality with a higher deposition rate. This step is performed in the presence of hydrogen. The pressure in the chamber is preferably 0.01 mbar to 1000 mbar, in particular 1 mbar to 800 mbar;

and the optional steps:

(d1)—a step in which the CVD of the germanium and the photon beam correspond to the frequency of the phonon due to the Ge—Ge bond is stopped, at a temperature below the temperature (T2) as far as a third temperature (T3) of 500° C. to 600° C., preferably 540° C. to 560° C., in particular 550° C., a step performed in the presence of hydrogen. The pressure in the chamber is preferably 0.01 mbar to 1000 mbar, in particular 1 mbar to 800 mbar;

(d2)—a step of CVD at the third temperature (T3) of an $Si_{1-x}Ge_x$ alloy, where x≤0.9, until an intermediate layer of $Si_{1-x}Ge_x$ having the desired thickness is obtained. The germanium precursor gas is preferably $GeH_4$. The precursor gas for silicon is $SiH_2Cl_2$, $SiHCl_3$, $SiCl_4$ and $Si(CH_3)_4$, in particular $SiH_4$. The photon beam (IR) and/or the two photon beams (IR and Raman) corresponding to the frequencies of the phonons due to the Si—Ge bond are next injected into the chamber by pointing to the substrate and according to the set of directional vectors L, W, Σ, ξ. This step is performed in the presence of hydrogen. The pressure in the chamber is preferably 0.01 mbar to 1000 mbar, in particular 1 mbar to 800 mbar;

(d3) a transition step, at the third temperature (T3), in which the CVD of the $Si_{1-x}Ge_x$ alloy changes to a pure germanium CVD. The flow of silicon precursor gas is stopped in order to achieve the change to the following step. The photon beam or beams corresponding to the frequency of the phonon due to the Si—Ge bond are also stopped in order to inject the photon beam corresponding to the frequency of the phonon due to the Ge—Ge bond. The change from the photon beam corresponding to the frequency of the phonon due to the Si—Ge bond to the photon corresponding to the frequency of the phonon due to the Ge—Ge bond must preferably take place in a synchronised fashion, preferably by simultaneous decrementing-incrementing of the power, a step carried out in the presence of hydrogen. The pressure in the chamber is preferably 0.01 mbar to 1000 mbar, in particular 1 mbar to 800 mbar;

(d4)—a step in which the CVD of the germanium is maintained at this temperature (T3) so as to obtain the deposition of germanium as a top layer and $Si_{1-x}Ge_x$ as an intermediate layer. During this step the photon beam corresponding to the frequency of the phonon due to the Ge—Ge bond is maintained. This step is performed in the presence of hydrogen and the pressure in the chamber is preferably 0.01 mbar to 1000 mbar, preferably 1 mbar to 800 mbar;

(d5)—a step in which the germanium CVD temperature is increased from the third temperature (T3) to a fourth temperature (T4) of 750° C. to 850° C., preferably 800° C. to 850° C. During this step the photon beam corresponding to the frequency of the phonon due the Ge—Ge bond is maintained. T4 is preferably equal to T2, and the step is performed in the presence of hydrogen, the pressure in the chamber is preferably 0.01 mbar to 1000 mbar, in particular 1 mbar to 800 mbar;

(e) a step of incrementing the temperature of the chemical vapour deposition (CVD) of the germanium from the first temperature (T1) to a second temperature (T2) limited to 750° C. to 850° C., preferably 800° C. to 850° C. This step is performed without the presence of the photon beam corresponding to the frequency of the phonon due to the Ge—Ge bond. This step is however performed in the presence of hydrogen. The pressure in the chamber is preferably 0.01 mbar to 1000 mbar, in particular 1 mbar to 800 mbar;

(f) continuation of the germanium CVD at the second temperature (T2) until the desired thickness of the layer of germanium. The photon beam corresponding to the frequency of the phonon due to the Ge—Ge bond is maintained. This step is performed in the presence of hydrogen and the pressure in the chamber is preferably 0.01 mbar to 1000 mbar, in particular 1 mbar to 800 mbar.

The invention claimed is:

1. Method for synthesising a material, in particular diamond, by chemical vapour deposition (CVD), according to which a plasma is created in a vacuum chamber in the vicinity of a substrate arranged to carry the material to be synthesised, and according to which a substance carrying carbon, in particular $CH_4$ or $C_2H_2$, and $H_2$, is introduced into the chamber in order to produce in the chamber a gas comprising substances carrying reactive carbon atoms in the form of unsaturated molecules or radicals from which the synthesis of said material will be performed, characterised in that the electromagnetic absorption and inelastic diffusion spectra of the material to be synthesised are used to take from the spectra the absorption frequencies that contribute to the reactions that lead to the formation of the material to be synthesised, and in that energetic rays are produced in the form of photon beams carrying quantities of energy determined by each of the frequencies corresponding to said absorption and inelastic diffusion frequencies, said photon beam being injected into the plasma where, for energy states of the solid material, an absorption of these photons having the energy corresponding to these energy states is effected by the substances carrying said reactive carbon atoms.

2. Method according to claim 1, characterised in that a carbon-carrier gas is introduced as said substance.

3. Method according to claim 1, characterised in that infrared rays are used as energetic rays for effecting a coupling between the energetic states of the unsaturated molecules or radicals and the energetic states of the phonons of the material.

4. Method according to claim 1, characterised in that X, UV and visible rays are used as energetic rays.

5. Method according to claim 1, characterised in that the material to be synthesised comprises a crystallographic lattice that determines a set of facies, for example an octahedron, or a dodecahedron in the case of diamond, represented by two sets of directional vectors, the first indicating the directions normal to the main reticular planes, with a higher atomic density determining the possible facies of said material, the second consisting of the wave vectors allowed for propagation of phonons according to the crystallographic structure of the material, said photon beam being oriented and injected in directions indicated by said two sets of directional vectors.

6. Method according to claim 1, characterised in that a beam of UVC rays is injected into the plasma.

7. Method according to claim 1, characterised in that the plasma is produced by creating an electrical field in the vacuum chamber, said electrical field being created by means of first and second electrical potentials, said first electrical potential is created in a first zone offset in the direction of the height with respect to the substrate and the second electrical potential is created in a second zone situated in the direct vicinity of the substrate, the first and second zones being adjacent to each other, said first and second potentials having a gradient directed towards the substrate, wherein the slope of the first potential is higher than that of the second potential.

8. Method according to claim 7, characterised in that the second potential is created by means of a generator placed at the periphery of the substrate.

9. Method according to claim 7, characterised in that the first potential is created by means of a grille and a filament placed above the substrate.

10. Method according to claim 1, characterised in that the substrate is maintained at a predetermined temperature during the deposition of the material to be synthesised.

11. Method according to claim 1, characterised in that the deposition is carried out in vapour phase with a hot filament.

12. Method according to claim 1, characterised in that, when the layer of the material to be synthesised has a thickness of at least 1 µm, the material is doped by injecting into the chamber a boron-carrier gas in a proportion 0.01 to 200 ppm with respect to the $H_2$, and in that a second photon beam having a frequency that corresponds to an electron-phonon interaction is injected into the plasma in order to cause superconductivity of the material.

13. Method according to claim 12, characterised in that the second photon beam is divided into a first beam fragment injected in the direction LO_($\Gamma \rightarrow$L and $\delta \rightarrow \xi$), and the second fragment of photon beams in the direction $\xi$, of the set of directional vectors L, W, $\Sigma$, $\xi$ with an offset of 4 mV with respect to the value of the non-doped diamond.

14. Method according to claim 1, characterised in that, when the layer of the material to be synthesised has a thickness of at least 1 µm, the material is doped by injecting into the chamber a boron-carrier gas in a proportion of 0.01 to 100 ppm with respect to the $H_2$, and in that a third photon beam having a frequency that corresponds to an electron-phonon interaction is injected into the plasma in order to cause semiconductivity of the material.

15. Method according to claim 14, characterised in that the third photon beam is divided into a first beam fragment injected in the direction L and a second fragment injected in the direction $\xi$, of the set of directional vectors L, W, $\Sigma$, $\xi$.

16. Method according to claim 1, characterised in that, when the layer of material to be synthesised has a thickness of at least 1 µm, the material is doped by injecting into the chamber a nitrogen-carrying gas with a ratio of 0.1 to 1 of nitrogen with respect to $CH_4$, and in that a fourth beam of photons having a frequency corresponding to an electron-phonon interaction that causes type n semiconductivity is injected into the plasma.

17. Method according to claim 16, characterised in that the fourth photon beam is injected into the plasma according to the set of directional vectors corresponding to the phonon frequency due to the presence of nitrogen for the type C centre, and/or according to three photon beams corresponding to the phonon frequency due to the presence of nitrogen for the type A aggregate, and/or according to four photon beams corresponding to the phonon frequency due to the presence of nitrogen for the type B aggregate.

18. Method for forming a semiconductor of type Si—Ge by chemical vapour deposition, characterised in that the deposition is carried out in a chamber and in that it comprises:
- a chemical vapour deposition of silicon on a substrate at a temperature of between 500° C. to 600° C. in the presence of hydrogen and having the chamber maintained at a pressure situated between 0.01 and 1000 mbar, said deposition being carried out by injecting into the chamber a photon beam corresponding to the frequency of the phonon due to the Si—Si bond until the deposited layer of silicon has a thickness of at least 3 nm;
- stabilisation of the temperature of the substrate at a first temperature situated between 400° C. to 550° C.;
- a chemical vapour deposition of germanium on the layer of Si at a temperature of between 400° C. to 550° C. until a layer Ge is obtained at a predetermined thickness with injection into the chamber first of a photon beam corresponding to the frequency of the phonon due to the Si—Ge bond and secondly another photon beam corresponding to the frequency of the phonon due to the Ge—Ge bond;
- incrementation of the temperature of the chemical vapour deposition to a value situated between 750° C. and 850° C. in the presence of hydrogen;
- maintaining the injection of a photon beam corresponding to a frequency of the phonon due to the Ge—Ge bond until a predetermined thickness of layer is obtained.

19. Method according to claim 18, characterised in that the photon beam is injected according to a set of directional vectors of silicon.

20. Device synthesising a material, in particular diamond, by chemical vapour deposition (CVD), the material to be synthesised having a crystallography with a set of possible faces, represented by a set of directional vectors where each vector indicates a direction normal to a given face of said material, said device comprising a substrate arranged to carry the solid material to be synthesised and a vacuum chamber comprising a plasma generator arranged to produce a plasma in the chamber in the vicinity of the substrate, said chamber comprising an entry arranged to introduce into the chamber a substance carrying carbon, in particular a carbon-carrying gas, in particular $CH_4$ or $C_2H_2$, and $H_2$, said chamber being arranged to produce therein, from the carbon-carrying substance and $H_2$, a gas comprising radicals or molecules in unsaturated form from which the synthesis of said material will be effected, characterised in that the device comprises a photon beam generator mounted on the chamber and arranged to produce energetic rays, in particular infrared rays and/or X, UV and visible rays in the form of a photon beam carrying quantities of energy determined by each of the frequencies corresponding to an absorption frequency taken from an electromagnetic absorption and inelastic diffusion spectrum of the solid material to be synthesised and which produces a reaction that leads to the formation of the solid material to be synthesised, said photon beam generator being mounted on the chamber so that said beam produced can be injected into the chamber at an angle that corresponds both to the given directional vectors of said solid material and to the wave vector of the Brillouin zone associated with the energy of the photon mode including the mode at the zone centre, determining the energy contained in the photon beam, said photon beam generator being mounted on the chamber in order to be able to inject the photon beam into the plasma and, for energetic states of the solid material, caused by said substance carrying reactive carbon atoms, an absorption of these photons having the energy corresponding to these phonic states.

21. Device according to claim 19, characterised in that it comprises another generator arranged to produce a beam of UVC rays, said other generator being mounted on the chamber to enable UVC rays to be injected into the plasma generated by said plasma generator.

22. Device according to claim 20, characterised in that it comprises a system for focusing the plasma mounted at the periphery of the substrate.

23. Device according to claim 22, characterised in that the plasma focusing system is formed by a ring.

24. Device according to claim 22, characterised in that the plasma focusing system is formed by a wire arranged in the form of a succession of block waves around the substrate.

* * * * *